(12) United States Patent
Castiglione et al.

(10) Patent No.: US 7,079,616 B2
(45) Date of Patent: Jul. 18, 2006

(54) PROCESS FOR GENERATING A VARIABLE FREQUENCY SIGNAL, FOR INSTANCE FOR SPREADING THE SPECTRUM OF A CLOCK SIGNAL, AND DEVICE THEREFOR

(75) Inventors: Corrado Castiglione, Turin (IT); Massimo Scipioni, Milan (IT); Carlo Alberto Romani, Milan (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 749 days.

(21) Appl. No.: 10/224,623

(22) Filed: Aug. 19, 2002

(65) Prior Publication Data

US 2003/0039330 A1 Feb. 27, 2003

(30) Foreign Application Priority Data

Aug. 24, 2001 (EP) .................................. 01830549

(51) Int. Cl.
*H03D 3/24* (2006.01)
(52) U.S. Cl. ........................................ 375/376; 327/158
(58) Field of Classification Search ................ 375/226, 375/371, 373–376; 327/147, 156, 159; 341/143, 341/155, 126
See application file for complete search history.

(56) References Cited

U.S. PATENT DOCUMENTS

| 4,546,331 | A |   | 10/1985 | DaSilva et al. |
| 5,055,802 | A | * | 10/1991 | Hietala et al. ................. 331/16 |
| 5,488,627 | A |   | 1/1996 | Harden et al. |
| 5,610,955 | A |   | 3/1997 | Bland |
| 5,625,358 | A | * | 4/1997 | Wilson et al. ............... 341/143 |
| 5,631,920 | A |   | 5/1997 | Hardin |
| 5,736,893 | A |   | 4/1998 | Puckette et al. |
| 5,943,382 | A |   | 8/1999 | Li et al. |
| 5,963,068 | A | * | 10/1999 | Hardesty et al. ............ 327/156 |
| 6,167,103 | A |   | 12/2000 | Hardin |
| 6,219,397 | B1 | * | 4/2001 | Park ........................... 375/376 |
| 6,404,249 | B1 | * | 6/2002 | Hayashida ................... 375/376 |
| 6,504,498 | B1 | * | 1/2003 | O'Brien ....................... 341/143 |
| 6,959,063 | B1 | * | 10/2005 | Nilsson et al. ............... 375/376 |

FOREIGN PATENT DOCUMENTS

| EP | 0 318 114 A2 | 5/1989 |
| WO | WO 01/22674 A1 | 3/2001 |

OTHER PUBLICATIONS

T. Musch, et al., "A Highly Linear Frequency Ramp Genrator Based on A Fractional Divider Phase-Locked-Loop", IEEE Transactions on Instrumentation and Measurement, IEEE Inc., New York, U.S., vol. 48, No. 2, Apr. 1999, pp. 634-637.

* cited by examiner

*Primary Examiner*—Khanh Tran
(74) *Attorney, Agent, or Firm*—Hogan & Hartson L.L.P.

(57) ABSTRACT

The use of a PLL including a phase detector responsive to the phase difference between an input signal and a feedback signal and which pilots an oscillator in function of this difference, is envisaged. The PLL also includes a feedback path that is responsive to the signal generated by the oscillator and which generates said feedback signal via at least one divider with a variable division ratio. The division ratio of said divider is modulated via a sigma-delta modulator, the input of which is fed with a triangular-wave modulating signal. The preferred application is that of a spread spectrum clock generator (SSCG) for digital electronic systems.

15 Claims, 4 Drawing Sheets

PROCESS FOR GENERATING A VARIABLE FREQUENCY SIGNAL, FOR INSTANCE FOR SPREADING THE SPECTRUM OF A CLOCK SIGNAL, AND DEVICE THEREFOR

FIELD OF THE INVENTION

The present invention refers to techniques that allow a variable frequency signal to be generated for use, for example, in broadening the spectrum (spread spectrum) of a square-wave clock signal generated via a PLL (Phase Locked Loop).

BACKGROUND OF THE INVENTION

All electronic devices emit more or less strong electromagnetic radiation during normal operation, with a spectral bandwidths ranging from very narrow bands to bands that cover wide zones of the electromagnetic spectrum. One consequence of these emissions can be evaluated in terms of "noise" or "interference" on other electronic equipment. The powers brought into play depend on the characteristics of the device in question.

The evolution of electronic technologies over recent years has certainly brought about an increase in radiated powers, as can be witnessed, for example, by the wide-scale diffusion of mobile phones and the tendency towards ever-increasing clock frequencies in digital components (microprocessors for example) and systems that use them (such as personal computers, various types of peripheral, etc.).

For these reasons, directives have been issued, e.g., at European Union level and by U.S. federal administrations, aimed at guaranteeing that electronic equipment has a certain level of immunity regarding radiation emitted by other devices and that each single device cannot emit beyond a certain power level.

With regard to the reduction of emissions due to high clock frequencies in digital systems, various methods exist that start from the presupposition of reducing the phenomenon at the origin.

For example, it is possible to control the wave form of clock pulses and/or the slew-rate or widen the spectrum (spread spectrum) of the clock signal. This technique, which is found to be the most efficient from many points of view, essentially aims at redistributing the energy of the clock signal over wider bands with respect to those the unmodulated clock would have. Instead of having a fixed frequency, the clock signal has a frequency that varies in a precise manner over time. Passing into the frequency domain, since the clock continuously changes its frequency, instead of the energy of the harmonics being concentrated at well-defined frequencies, it is distributed over a certain range, the amplitude of which depends on how much the modulation shifts the signal frequency, i.e. the index of modulation.

Naturally, the modulating signal must have a much lower frequency than the clock signal because the latter signal is intended to synchronize a digital system. Only if the variations in clock frequency are sufficiently slow does the functioning of the entire system remain uncompromised. In addition, when a digital system is designed, it should be dimensioned for the highest frequency that the clock reaches when it is modulated. As opposed to what happens with pulse shaping, in spread spectrum techniques the clock signal remains a square waveform and its wave shape thus remains unaltered.

The spread spectrum technique described allows realization of devices currently known as SSCGs (Spread Spectrum Clock Generator) or "dithered PLLs", intended for use as clock signal generators in digital ASICs for example. It allows the electromagnetic emissions (EMI) of a quartz oscillator, for example, to be reduced by 10–20 dB at determined frequencies by "spreading" the frequencies over a broader frequency range. This technique has been known for some time, as is attested, for example, by U.S Pat. Nos. 4,546,331, 5,488,627, 5,610,955, 5,631,920, 5,736,893, 5,943,382 and 6,167,103.

In particular, this last document describes the solution of modulating the PLL feedback divider via a fixed, memory-mapped synthesizer. A triangular "cusp-like" modulating signal is used in an attempt to improve the borders of the clock's spread spectrum.

SUMMARY OF THE INVENTION

The object of this invention is the realization of a further improvement in the previously described spread spectrum technique, both with regards to the efficiency of the final result that is achieved and in respect of the possibility of realizing adaptable and technologically simple devices, avoiding the need to resort to memories and/or critical analogue components.

In accordance with this invention, that object is achieved thanks to a process possessing the characteristics specifically referred to in the claims that follow. The invention also relates to a corresponding device.

The invention allows a system to be realized that can "spread" the spectrum of a square-wave clock signal via frequency modulation with a triangular modulating signal. In the currently preferred embodiment, the solution of the invention contemplates the realization of a PLL in which the feedback divider, or more precisely its division factor, is modulated by a sigma-delta modulator. The complete system is thus composed of a PLL, a triangular waveform generator (modulating signal) and a sigma-delta modulator.

BRIEF DESCRIPTION OF DRAWINGS

The invention will now be described, by way of a non limitative example, with reference to the enclosed drawings, wherein.

DETAILED DESCRIPTION

Figure 1:
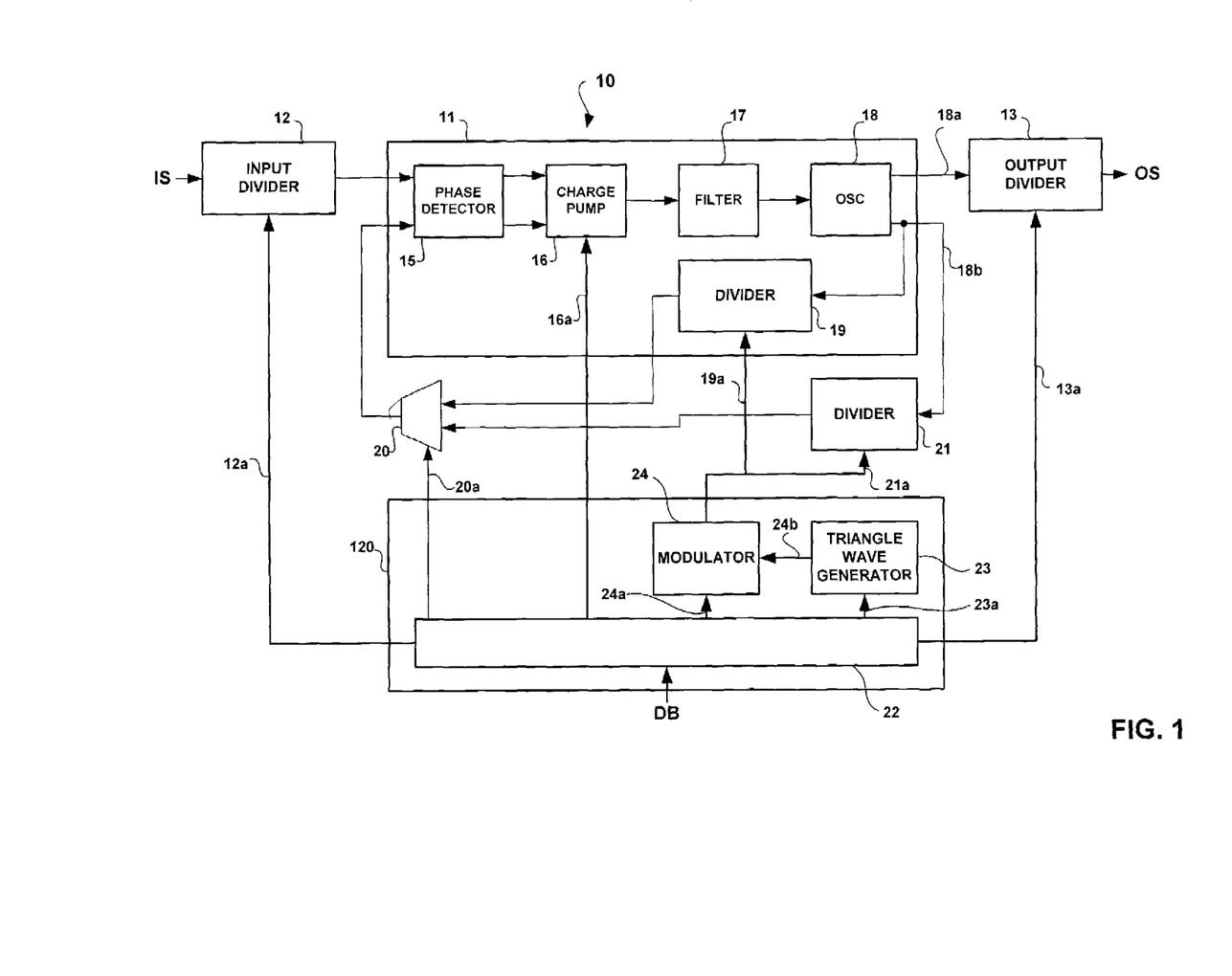
FIG. 1 represents, in the form of a block diagram, the structure of a circuit realized in accordance with the invention.

In the layout shown in FIG. 1, numerical reference 10 indicates an entire circuit capable of performing the function of an SSCG (Spread Spectrum Clock Generator) or "dithered PLL", that is the generation, starting from an input signal IS consisting of a constant frequency clock signal, of an output signal OS consisting of a "dithered" square-wave signal, that is to say with a frequency modulation that gives rise to a spreading out of the relative power spectrum.

The core of circuit 10 consists of a PLL 11 to which two divider circuits 12 and 13 are associated, in input and output respectively, as well as a control block, indicated in its entirety as reference 14.

According to a commonly known architecture, the PLL includes:

- a phase detector 15 capable of detecting the phase shift between the first input signal, consisting of the divider circuit 12 output signal in the example illustrated herein, and a second signal originating from the feedback of the PLL, which will be better described in the following,
- a charge pump 16 driven by the phase detector 15 and acting under the control of module 14,
- a filter 17 that receives the output signal of the charge pump 16 as input,
- an oscillator (typically a VCO, acronym for Voltage Controlled Oscillator) controlled by the output signal of the filter 17; the oscillator 18 generates an output signal to be sent to the divider 13 for generating an output signal OS, and
- a divider circuit 19 including a PLL feedback loop and adapted to receive the output signal of the oscillator 18 for subsequent transmission to the second input of the phase detector 15 via a mux module, indicated as reference 20, the characteristics of which will be better illustrated in the following.

Proceeding with the explanation of the block diagram in FIG. 1, reference 21 indicates an additional divider that is also arranged between the output of oscillator 18 and the mux module 20. As will become clearer in the following, the divider 21 is intended to substitute the divider 19 when the PLL 11, configured to have a fixed output frequency according to similarly fixed input frequency, is made to operate—in accordance with the invention—so as to generate an output signal, the frequency of which is to be subjected to modulation.

Passing on to examine the structure of the control module 14, reference 22 indicates a set of registers that can be controlled via a data bus DB. The register block 22 is in turn intended to control, in addition to the dividers 12 and 13 (via the respective control lines 12a and 13a), the charge pump 16 (via the line 16a) and the mux module 20 (via the line 20a), a triangular wave generator 23 (via the line 23a) and a sigma-delta modulator 24 (via the line 24a).

The triangular wave generator 23 supplies its output signal as a pilot signal to the sigma-delta modulator via the line 24b.

References 19a and 21a indicate two lines by means of which the modulator 24 acts upon the dividers 19 and 21.

The previously illustrated PLL structure, which will be described in greater detail further on, corresponds to the currently preferred embodiment of the invention.

As will be nevertheless evident to a technical expert in this field, the types of PLL that are known and used in technology are many and the possible variants that can be implemented are practically unlimited. These variants can impact the specific methods of realization of the individual blocks (for example: characteristics of the phase detector 15, order of the filter 17, type and characteristics of the oscillator 18, characteristics of the feedback path, etc.), as well as causing the possible absence of some of the illustrated blocks (for example, the charge pump 16, the presence of which is obviously related to the possible realization of circuit 10 in the form of an integrated circuit).

Similarly, the fact of having represented both divider 19 and divider 21 in the diagram in FIG. 1 corresponds to a preferred embodiment of the invention, whereby it is wished to be able to choose (by intervention on the mux module 20) between the "undithered" and "dithered" modes of operation. This implies that the solution in accordance with the invention is capable of being implemented with the presence of a single divider 21, intended to assure the "dithered" mode of operation; should this solution be adopted, neither the presence of the divider 19, nor that of the mux module 20 is required.

In addition to the various components of the control module 14, similar considerations also apply to the dividers 12 and 13, the presence of which, although preferred because it renders the operational characteristics of the device 10 more flexible, is not mandatory.

By way of example, (and naturally without being interpreted in any manner considered as limitative to the scope of the invention), the Applicant has successfully realized a device 10 with components corresponding to the diagram in FIG. 1 and exhibiting the following characteristics:

- clock input frequency (IS) 24 MHz,
- selectable base frequency of VCO 18, with default value of 384 MHz,
- modulation frequency selectable from 0.5 to 100 KHz,
- division factor for the input divider 12 selectable in range 2 to 255,
- division factor for the output divider 13 selectable in ranges 1 to 32 or 1 to 128,
- division factors for the feedback dividers 19 and 21 selectable in range 2 to 255,
- selectable depth of modulation, with preferred range 0 to 2.5%,
- selectable order for the sigma-delta modulator 24, with preferred choice of an order not below the second order, and
- current value for the charge pump selectable in range 270 nA to 3610 nA.

The phase detector 15 receives two clock signals in input:
- reference clock, the frequency of which corresponds to the frequency of the input signal IS divided by the division factor of the input divider 12, and
- feedback clock, arriving via the mux module 20 from divider 19 or divider 21.

The outputs of the phase detector 15 pilot the charge pump 16. The latter is adapted to generate a current that depends on the phase difference between the two clocks connected to the inputs of the detector 15. The resulting current is also proportional to a numerical value supplied on the line 16a by the registers 22 of the control module 14.

In particular, the charge pump 16 has the function of supplying or extracting charge with respect to the loop-back filter 17 via current pulses.

The filter 17 receives the current, filters it and supplies the pilot voltage to the oscillator 18.

In this case, where the maximum modulation frequency is set to 100 KHz, the filter 17 can be realized so as to let the third harmonic of this frequency pass through, this being sufficient to obtain an undistorted triangular waveform.

In the currently preferred embodiment, the filter 17 is an RCC type filter with two poles and one zero. This solution is suited for integration in situations where there are pressing limits on capacitance and resistance values, whilst still assuring the presence of a stable voltage reference at the input to the oscillator 18, with an entirely satisfactory filtering effect on noise that might enter the PLL loop.

In the currently preferred embodiment, the oscillator 18 is capable of generating a square waveform with a frequency that is inversely proportional to the voltage applied at its input. The oscillator should preferably be realized with an achievable frequency range from 200 to 622 MHz.

This oscillator can be realized with a trigger circuit with an integrator in the feedback loop. In practice, a constant is integrated until the integrator output reaches a certain threshold, after which the same constant is integrated but with its sign inverted, thereby reaching a second threshold that makes the cycle start again. It is preferable that a saturation block, the purpose of which is to limit the frequency of oscillation in both the upward and downward directions, is present on the input. Preferably, the oscillator 18 should have a negative gradient of approximately 1.2 GHz/Volt, i.e. it gives the maximum frequency in output when the minimum voltage is applied in input and, vice versa, the minimum frequency in output when the maximum voltage is applied in input.

The oscillator also contains a filter referred to the feed voltage and not to ground, and hence it starts at the beginning of the minimum frequency.

The role of the output divider 13 is to reduce the frequency of the clock in output from the PLL block 11.

In the preferred manner, the output signal from the oscillator 18 is directly routed to the output divider 13 on line 18a, whilst it is transmitted to the dividers 19 and 21 over another line, indicated as 18b, after it has already been divided by two within the oscillator.

The divider 19 divides the frequency received from the oscillator 18 (already divided by two) by a fixed reference number supplied by the sigma-delta modulator 24 via the line 19a.

As has already been stated, the divider 19 (which can be considered as a kind of "internal" divider with respect to the PLL 11), corresponds to a fixed, operational configuration for the device 10, that is to say a configuration in which, once the frequency of the input signal IS is established, the frequency of the output signal OS remains fixed in a likewise manner.

The output signal from the oscillator 18 on line 18b, with its frequency already divided by two, is also supplied to the divider 21 (which can be considered as a kind of "external" divider with respect to the PLL 11), which is also driven by the sigma-delta modulator 24.

The divider 21 reloads a new value on every cycle: this means that the division factor can be changed on each cycle.

Preferably, the divider 21 is also used to supply the clock signal to the digital control module 14.

In addition to avoiding the need for using a flexible memory under two different clock domains (the reference one and that characterizing the feedback loop, originating from the divider 21), this choice avoids giving rise to synchronization problems and side effects related to dithering.

It effect, one could think of timing the operation of the sigma-delta modulator 24 from the reference clock fed as the input signal IS to the input of divider 12: for example, one could be dealing with a clock arriving from an external, 24 MHz quartz generator. In this case, the counter values generated in the PLL feedback path would be produced with a fixed frequency but sampled (essentially at the flip-flops' flop level) with the frequency of the feedback path clock.

Since this last frequency can be much higher or lower with respect to the reference clock, phenomena of sampling the counter values belatedly or in advance could arise.

Should the sampling be late, the counter in the feedback path could skip a step. Should the sampling be too fast, the counter could take on the same value twice.

In consideration of the contemplated modulation values, this behaviour is likely to give rise to phenomena of instability that—observed on the frequency diagram of the output signal—give the impression that the corresponding waveform is "burning", like a flame.

The entity of this effect depends on the current value of the charge pump 16 and the band of the filter 17 and, in general, the reaction speed of the system: very quick systems (with high current values in the charge pump 16 and filter 17 with a wide band) are much more exposed to this negative effect.

This negative effect can be completely avoided by using the feedback path clock for timing the modulation function (dithering).

Another negative effect that it is important to avoid is the so-called phase jump, which can be encountered in the presence of a high depth of modulation and/or a charge pump current level that is too low. In these conditions, the PLL 11 is very sluggish with respect to the speed required for performing the modulation function. Since the PLL is not capable of correctly reacting to the change in frequency that is imposed on it, the oscillator 18 is not capable of following the precise gradient requested by the modulation function, and so the feedback path clock jumps (forwards or backwards) an entire counter pulse. This drawback can be avoided by judiciously choosing the joint values of the depth of modulation and the charge pump current. For this reason, in the currently preferred embodiment of the invention, it is intended that both of these parameters be controlled via the module 12.

An aspect of particular significance of the solution of the invention is given by the methods adopted for performing the modulation or dithering function via the triangular waveform generator 23 and the sigma-delta modulator 24.

Where it is wished to implement a spreading action on the spectrum of a clock signal (for the objectives illustrated at the beginning of this description), modulation using a sinusoidal modulating signal could also possibly be implemented. The choice of using a triangular waveform is found to be preferential, however, when considering the end effects on the spectrum of the modulated signal since it avoids the creation of lateral spikes in the final spectrum that is produced. This result is ascribable to the fact that when passing through the zero point, a triangular waveform has a smaller derivative than a sinusoidal one. This means that the signal modulated with a triangular modulating signal exhibits slightly less attenuation in the vicinity of the central frequency, but it still presents two lower lateral lobes, as the modulating signal has two fronts and a constant derivative.

Instead, with regards to the specific ways of performing the modulation, one could consider inserting the modulating signal directly at the node of the oscillator 18 and use the PLL as a clock frequency multiplier, having the reference clock already modulated, or modulate the division factor of the divider in the feedback path.

The solution described in FIG. 1 takes into account the fact that totally integrated, digital PLLs (DPLL) are already available, even with regards to the loop filter, and are capable of operating as clock generators in very complex digital ASICs where the least possible area must be occupied.

An already existing "core" example of a PLL of this type is the AZ_PLL81 component, produced by the Applicant, which has in fact been used as the basis for realizing the circuit shown in FIG. 1. All of this while providing the possibility of pairing the divider 19 already present on the circuit with the divider 21 that, during the "dithered" mode of operation, can have its division factor subjected to modulation by the sigma-delta modulator 24. All of this whilst being able to use a completely digital approach with the generation of a digitised triangular waveform, destined to be modulated by the modulator 24.

The fact of resorting to a sigma-delta modulator is related to the fact that the modulator exhibits over-sampled system characteristics in addition to the capability of realizing a shaping function for handling quantization noise ("noise-shaping").

In a quantizer, once the number of bits is selected, the power of the quantization noise is defined, which remains constant as the sampling frequency changes. If one assumes that the input lies within the dynamic range of the quantizer, the quantization noise spread shrinks to a window situated between plus and minus ½ LSB, where LSB indicates the least significant bit of the binary string representing the quantized signal. If one assumes that the noise is evenly distributed in the window it can be seen that, defined the signal band $f_0$, if the sampling frequency is raised beyond the minimum Nyquist frequency of $2f_0$, the power of the quantization noise will distribute itself over a wider band and hence the spectral power density will diminish. In other words, the power level of noise present in the signal band is reduced in an over-sampled system, consequently increasing the signal/noise ratio.

In addition to effecting this lowering of the quantization noise power spectrum, the sigma-delta modulator is also capable of modifying the shape of this spectrum, thereby realizing a noise-shaping function and thus changing the shape of the spectral density of the quantization noise power spectrum.

In this manner, it is possible to concentrate this noise at half of the sampling frequency (hence around $f_S/2$), in other words outside of the band of interest, thereby achieving a further improvement in the signal/noise ratio.

This effect is achieved thanks to the fact that the sigma-delta modulator applies a modulation based on the principle of only transmitting the amplitude difference between two successive samples. This allows a much smaller number of bits to be used than would be necessary to transmit the full description of the signal.

The simplest form of this modulator employs a single-bit quantizer that assumes the value "0" if the signal drops and the value "1" if the signal rises.

In order for everything to work correctly, the samples that describe the signal must be strongly correlated with each other, and this can be achieved precisely thanks to oversampling.

Figure 2:
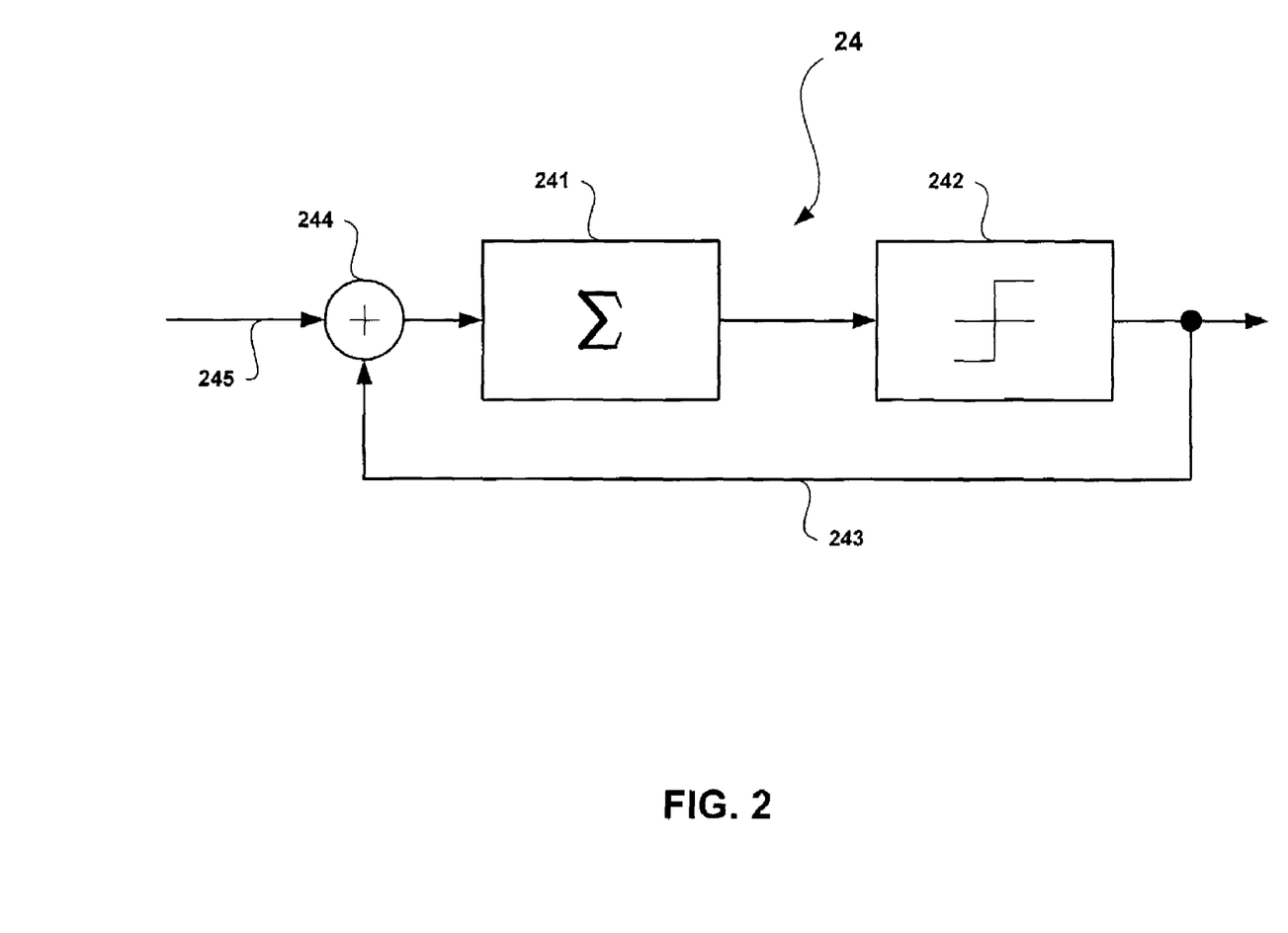
FIGS. 2 and 3 represent, always in the form of block diagrams, the general structure of one of the elements included in FIG. 1.

The simplest structure for a sigma-delta modulator is that shown in FIG. 2, essentially consisting of a cascaded integrator 241 and quantizer 242, closed in a feedback loop, including a feedback line 243 that takes the output signal from the quantizer 242 to an input summer node 244. In consequence, the signal fed to the integrator 241 is composed of the difference between the modulator input signal, present on line 245, and the feedback signal present on line 243.

Naturally, as the number of bits on the quantizer 242 increases, so does the performance of the modulator because the quantization noise is reduced.

Further improvements can be made to the system by adequately modifying the feedback loop. In particular, increasing the number of integrators accentuates the noise-shaping effect. The number of integrators included in the modulator 24 indicates the order of the modulator in question. Thus, a system with two integrators is known as a second order sigma-delta modulator and a modulator with three integrators is known as a third order modulator. Various possible configurations for connecting these integrators (or accumulators) also exist.

Needless to say, all that has been stated in precedence in relation to sigma-delta modulators corresponds to knowledge and implementational criteria that are well-known in the technical sphere and, as such, do not need to be described in detail herein.

Within the context of this description, it will be sufficient to remember that the circuit in accordance with the invention is preferably implemented in a manner such that the order of the sigma-delta modulator 24 is selectable, the currently preferred choice being oriented towards a modulator with an order not below that of the second order.

Figure 3:
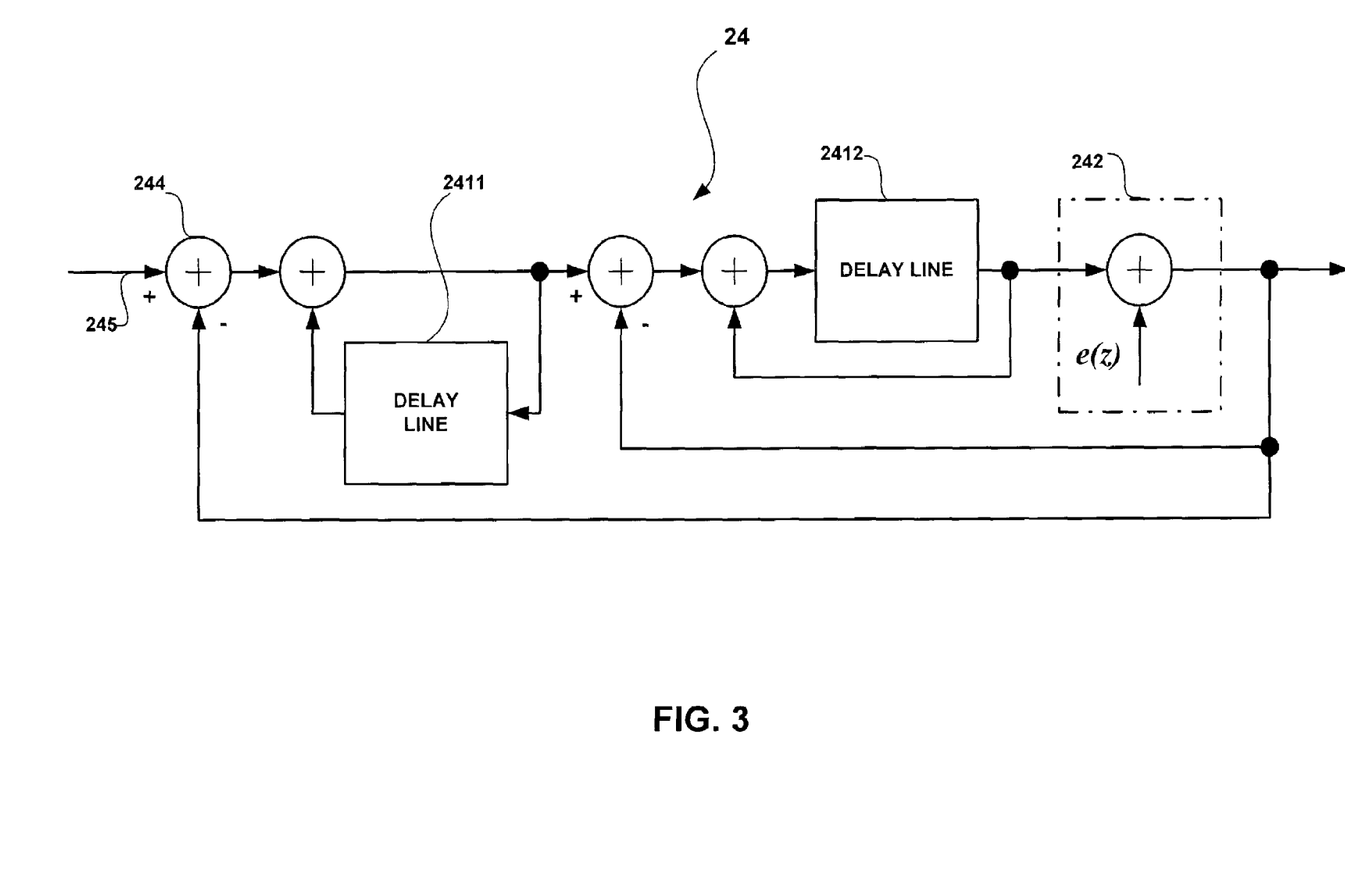

Such a modulator corresponds to the layout illustrated in FIG. 3, where the integrator 241, realized in the form of two accumulators in cascade, including two delay lines 2411 and 2412 connected so that each one acts as an accumulator, can be seen. All of this happens according to already known criteria, in function of the layout illustrated in FIG. 3.

As has been stated, the output signal from the modulator 24 has the function of modulating the division factor of the divider 21.

To better understand the relative principle of operation, the case of a non-modulated PLL, that is with a divider in the feedback loop with a division factor of N, should be considered. It should also be presumed that the PLL is in the locked condition.

If the value of the division factor is changed from N to N+k at a certain point, the PLL will react to this change by altering the output frequency of the oscillator and then return to the locked state within a certain time interval defined by the band of PLL.

The idea that the solution in accordance with the invention is based upon, is therefore precisely that of changing the division factor of the divider 21 using a sequence of adequate values, letting the PLL 11 to which the divider 21 is associated, with its time constant defined by the closed loop band, follow these continuous variations.

The technique of varying the division factor of the feedback loop divider has already been used in frequency synthesizers. In this case, however, the variations are normally set in a discrete and discontinuous manner to achieve a selectable, fixed frequency in output, normally consisting of a non-integral multiple of the reference signal.

In the case of the solution illustrated in FIG. 1, the division factor of the divider 21 is set by the output of the sigma-delta modulator 24.

The PLL 11, in locked situations, responds to the stimulation due to the division factor being changed like a linear system. This implies that the response to the change in the division factor (which can be seen as a step-wise stimulus) intervenes according to an exponential law defined by the position of the closed loop poles of the PLL 11. Since the closed loop poles are complex conjugates, there will be some oscillation in responding to the step. In order to follow the triangular profile in the most faithful manner, it is therefore advisable that the variations in the division factor are sufficiently rapid to remain within the linear zone of the exponential.

If the division factor remains constant for too long, the overall result is a distortion of the desired triangular waveform modulation. Each time that the input signal to the sigma-delta modulator crosses the zone between two quantizer steps, one is in a zone where the output of the quantizer might be constant.

Since, as is known, the more the quantization error is uncorrelated, the greater is the variation in the sigma-delta modulator output, even in the presence of a constant input, it would appear advantageous—as has already been stated in precedence—to use sigma-delta modulators 24 with an order greater than one and preferable at least of order two. This is specifically to avoid having the same division factor for too long: as the order of the modulator 24 increases, so does the correlation of the quantization error, which thus allows ever increasing improvements in the faithful reproduction of the desired modulating waveform to be achieved.

This waveform, produced by the generator 23, is typically a triangular waveform with a frequency between 10 and 100 KHz. The relative spectrum is only composed of odd harmonics with amplitudes that gradually decrease as the frequency rises.

The sampling frequency must therefore be chosen with a sufficiently high value in order to benefit from the previously described advantages of oversampling, and preferably using a clock signal already present in the system.

This is the reason for which the same frequency as that of the reference clock is chosen, but with the synchronization actuated—as has been previously stated—via the feedback loop clock. This signal is thus subjected to dithering, with a frequency that varies over time according to a law defined by the modulating signal of the system.

As has already been illustrated in reference to the so-called "flame effect", because the modulation index periodically assumes positive and negative values between two opposite limits, the front of the feedback loop clock finds itself, for a certain period, ahead of the front of the reference clock and, for a certain period, behind this reference signal clock front.

This could give rise to shortcomings, which are instead overcome by referring to the feedback loop clock. This is because the division factor is only changed when the divider (from which the feedback loop clock is generated) has finished counting.

However, this way of proceeding causes distortion in the triangular waveform. In fact, as the parts of the positive peak of the triangular waveform are reached, the feedback clock runs faster and, vice versa, as the lower points are approached, the feedback clock slows down.

The fronts of the triangular waveform are therefore not perfectly linear, but have a quadratic or cusp-like shape. Due to the appearance of small, even harmonics, this phenomenon can also be detected via spectral analysis.

Nevertheless, experiments conducted by the Applicant demonstrate that this distortion results in an improvement in the spectral shape of the output signal OS. In fact, the aforesaid distortion phenomenon of the triangular waveform causes a further attenuation of the lateral lobes of the spectrum of the signal subjected to modulation, which contributes to improving the performance of the device as a spread spectrum clock generator.

It may also be observed that, even if the spectrum of the triangular waveform extends to infinity, provisions for an anti-aliasing filter between the generator 23 and the sigma-delta modulator 24 are, in fact, completely superfluous. Similarly, as has previously been stated, the filter 17 can be dimensioned in a manner that guarantees a closed loop band with a bandwidth that is not particularly over-dimensioned with respect to the harmonic content of the modulating waveform.

For example, experiments conducted by the Applicant demonstrate that, in the presence of a modulating frequency with a maximum frequency level of 100 KHz, to allow the first two or three harmonic to pass through in addition to the fundamental one, it is sufficient to dimension the filter 17 such that a closed loop band of just under 300 KHz is guaranteed; this value is lower than that which would be expected on the basis of linear considerations.

Returning to the circuit illustrated in FIG. 1, the registers of block 22 sample the data arriving from the external bus DB. This preferable only happens when a strobe line is asserted (local_reset_n).

The reset values of the registers determine the behaviour of the PLL after reset. In particular, as can be easily seen from the chronogram in FIG. 4, all registers sample the state of the bus when there is a transition of local_reset_n from 0 to 1. Since this bit is synchronized with the internal clock, it is not detected until the two-stage synchronizer propagates it internally. This implies that the bus must be stable for at least 3 internal clock cycles (feedback clock).

Figure 4:
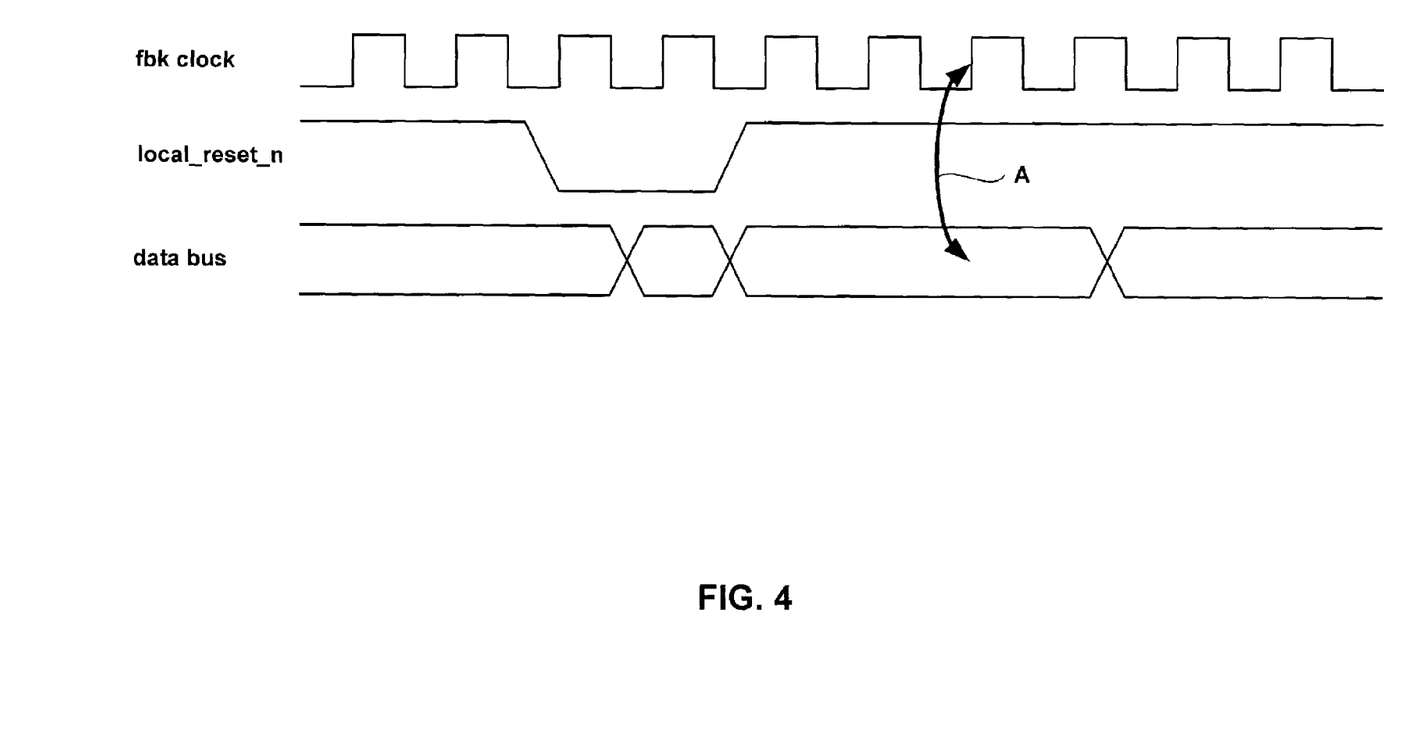
FIG. 4 is a chronogram illustrating possible circuit control methods in accordance with the invention.

As the maximum period of the internal clock can be two times that of the reference period, if the reference frequency of the signal IS is 24 MHz, the minimum hold period for bus data must be 250 ns. The minimum duration of the local_reset_n negative pulse must be approximately 90 ns.

The upper line on the chronogram in FIG. 4 shows the development of the square wave representing the feedback clock, while the double arrow A indicates the instant in which data sampling is effected.

Normally, the operational sequence of the circuit 10 commences by asserting a system reset, with consequent release of the reset when the PLL has reached the locked state in conditions of static operation, that is when the fixed divider 19 is inserted into the feedback path.

At this point, intervening on the mux module 20 causes the divider 21 to be "substituted" in place of the divider 19. When the locked state is reached again, the registers 22 will be programmed and the "dithering" operational mode activated.

Should it be desired to modify the frequency of modulation or its slope, it is normally better to deactivate the "dithering" operational mode, wait again for the PLL to lock-in, program the register 22 in the appropriate manner and reactivate the "dithering" operational mode.

Naturally, the lock signal does not have any particular significance during the modulation phase.

The described solution can be used to particular advantage in all digital systems synchronized by a high-frequency clock (hundreds of MHz), in bus drive systems and, lastly, in power switching systems. The described solution is particularly effective regarding its utilization in printers, where both the communications logic between the printer and the computer for processing data, and the printer head drive section are present: since the drive lines of these heads operate at high frequencies (48 MHz) and are also power lines, this is where the greater part of the emissions arise.

Naturally, the principle of the invention being understood, the constructional details and embodiments could be extensively changed with respect to that described and illustrated, without departing from the scope of this invention, as defined in the enclosed claims.

The invention claimed is:

1. A device for generating an output signal with a frequency which varies according to a law of modulation, comprising:
   a PLL which includes,
      a phase detector, responsive to the phase difference between an input signal and a feedback signal and which drives, as a function of said difference, an oscillator for generating an output signal, and
      a feedback path responsive to said signal generated by the oscillator and which generates said feedback signal via at least one divider, wherein said at least one divider has a variable division ratio, and is provided with a control module for selectively varying said division ratio according to said law of modulation, wherein said feedback path of the PLL includes said divider with a variable division ratio according to said law of modulation signal and an additional divider with a fixed division factor, said dividers with variable and fixed division factors respectively, both being responsive to the signal generated by said oscillator and arranged for generating said feedback signal; said feedback path also including a selection unit for operatively connecting, to said phase detector, said divider with a fixed division ratio, to achieve operation of said device with a constant frequency output signal, or said divider with a variable division ratio, to achieve operation of said device with a variable frequency output signal according to said modulation law.

2. A device according to claim 1, wherein said signal generated by said oscillator is fed to said at least one divider following frequency division.

3. A device according to claim 2, wherein said signal generated by said oscillator is fed to said at least one divider following frequency division by a factor of two.

4. A device according to claim 1, further comprising a sigma-delta modulator and in that said control module generates an input signal for said sigma-delta modulator corresponding to the law of modulation, so as to obtain a corresponding output signal; said output signal of said sigma-delta modulator driving said variable division ratio of said at least one divider.

5. A device according to claim 4, wherein said feedback path generates a respective feedback clock signal and in that the operation of said sigma-delta modulator is timed by said respective clock signal generated by said feedback path.

6. A device according to claim 4, wherein said sigma-delta modulator is at least a second order modulator.

7. A device according to claim 1, wherein said control module is associated with a generator for generating said law of modulation as a triangular wave law of modulation.

8. A device according to claim 1, wherein said oscillator generates a square-wave output signal.

9. A device according to claim 1, further comprising a charge pump for driving said oscillator.

10. A device according to claim 9, wherein said control module is configured to selectively vary the level of current generated by said charge pump.

11. A device according to claim 1, wherein said law of modulation presents a given depth of modulation and in that said control module varies the level of current generated by said charge pump in a coordinated manner with said depth of modulation.

12. A device according to claim 1, further comprising an input divider with an input division factor, said input divider being fed with a reference signal at a given frequency and being arranged for feeding a replica of said reference signal with the frequency divided by said input division factor as an input signal to said phase detector.

13. A device according to claim 12, wherein the input division factor of said input divider is selectively variable under the control of said control module.

14. A device according to claim 1, further comprising an output divider with an output division factor, wherein said output divider receives the signal generated by said oscillator and generates, as the output signal from the device, a replica of the signal generated by said oscillator with the frequency divided by said output division factor.

15. A device according to claim 14, wherein the output division factor of said output divider is selectively variable under the control of said control module.

* * * * *